(12) United States Patent
Murazaki et al.

(10) Patent No.: US 7,927,512 B2
(45) Date of Patent: Apr. 19, 2011

(54) PHOSPHOR AND LIGHT EMITTING DEVICE

(75) Inventors: Yoshinori Murazaki, Komatsushima (JP); Yoshiki Sato, Anan (JP)

(73) Assignee: Nichia Corporation, Anan-shi (JP)

( * ) Notice: Subject to any disclaimer, the term of this patent is extended or adjusted under 35 U.S.C. 154(b) by 626 days.

(21) Appl. No.: 11/997,807

(22) PCT Filed: Aug. 3, 2006

(86) PCT No.: PCT/JP2006/315391
§ 371 (c)(1),
(2), (4) Date: Feb. 4, 2008

(87) PCT Pub. No.: WO2007/015542
PCT Pub. Date: Aug. 2, 2007

(65) Prior Publication Data
US 2010/0219746 A1    Sep. 2, 2010

(30) Foreign Application Priority Data
Aug. 4, 2005 (JP) .................... 2005-226089

(51) Int. Cl.
*H01L 33/00* (2010.01)
*G02F 1/13357* (2006.01)
*C09K 11/59* (2006.01)
*C09K 11/64* (2006.01)
*C09K 11/55* (2006.01)
*C09K 11/62* (2006.01)

(52) U.S. Cl. .................... 252/301.4 F; 313/503; 257/96

(58) Field of Classification Search ............ 252/301.4 F, 252/301.6 F; 313/503; 257/98
See application file for complete search history.

(56) References Cited

U.S. PATENT DOCUMENTS

| | | | |
|---|---|---|---|
| 5,839,718 A | 11/1998 | Hase et al. | |
| 2003/0020101 A1* | 1/2003 | Bogner et al. | 257/233 |
| 2004/0051111 A1* | 3/2004 | Ota et al. | 257/98 |
| 2004/0090174 A1* | 5/2004 | Tasch et al. | 313/503 |
| 2004/0104391 A1 | 6/2004 | Maeda et al. | |

(Continued)

FOREIGN PATENT DOCUMENTS
AT    410266    *  3/2003

(Continued)

OTHER PUBLICATIONS

Japanese Office Action for corresponding JP Application No. 2007-529526, Sep. 14, 2010 (w/ Engilsh translation of relevant part).

*Primary Examiner* — C. Melissa Koslow (74) *Attorney, Agent, or Firm* — Ditthavong Mori & Steiner, P.C.

(57) ABSTRACT

A light emitting device includes a light emitting element 1 that has a light emission peak wavelength in a range from 300 nm to 530 nm, and a phosphor 2 that absorbs light from the light emitting element 1 and converts the wavelength of the light to emit light with a light emission peak wavelength different from the light emitting element. The phosphor is represented by the general formula $M^1_{5-x}Eu_xM^2_mM^3_nO_{2m+(3/2)n+5}$ where x, m and n fall within ranges $0.0001 \leq x \leq 0.3$, $1.0 \leq m \leq 2.5$ and $0 \leq n \leq 2.5$, $M^1$ is at least one element selected from the group consisting of Mg, Ca, Sr, Ba and Zn, $M^2$ is at least one element selected from the group consisting of Si, Ge and Sn, and $M^3$ is at least one element selected from the group consisting of B, Al, Ga, In and rare earth elements.

2 Claims, 5 Drawing Sheets

U.S. PATENT DOCUMENTS

2004/0227465 A1　11/2004　Menkara et al.

FOREIGN PATENT DOCUMENTS

| | | | |
|---|---:|---|---:|
| AT | 410266 B | | 3/2003 |
| DE | 10259946 A1 | | 7/2004 |
| DE | 10259949 | * | 7/2004 |
| FR | 2846663 | * | 5/2004 |
| FR | 2846663 A | | 5/2004 |
| JP | 2003-515655 | | 5/2003 |
| JP | 2004-115633 | | 4/2004 |
| JP | 2005-277441 | | 10/2005 |
| WO | WO 03/021691 | | 3/2003 |
| WO | WO 2004/044090 | | 5/2004 |
| WO | WO 2004085570 A | | 10/2004 |

* cited by examiner

FIG.8

PHOSPHOR AND LIGHT EMITTING DEVICE

TECHNICAL FIELD

The present invention relates to a light emitting device that can be used for a signal light, a lighting device, a display, an indicator, various types of light sources and the like, and includes a phosphor. In particular, the present invention relates to a light emitting device that includes a phosphor that is excited by light emission spectrum from a light emitting element and can emit light in the visible range, and can emit white light, reddish orange light and the like.

BACKGROUND ART

Various types of phosphors are known that emit light in a range from the ultraviolet range on the longer wavelength side to the visible light range on the shorter wavelength side. However, a phosphor is not known that has excellent light resistance, and effectively emits reddish orange light. As a phosphor that emits green light, a (Sr, Ca)S:Eu group phosphor is mainly used. However, the (Sr, Ca)S:Eu group phosphor has poor weather resistance and low light emission efficiency.

As a silicate yellow group phosphor, which absorbs blue light that is emitted by a blue light-emitting diode and emits yellow range light different from the (Sr, Ca)S:Eu group phosphor, a silicate phosphor is known that is represented by the chemical formula of $Sr_2SiO_4$:Eu (see Patent Document 1, for example).
Patent Document 1: Japanese Patent Laid-Open Publication No. 2005-277441

DISCLOSURE OF INVENTION

Problems Solved by the Invention

However, known phosphors that emit reddish orange light do not have sufficient light emission efficiency if used for light sources in that displays and lighting devices are also included. It is required to improve the intensity and the mass-producibility of a phosphor that emits reddish orange light. In particular, a phosphor is not known that is excited by light in a range from the ultraviolet range on the longer wavelength side to the visible light range on the shorter wavelength side and can emit reddish orange light at sufficient intensity as compared with a $Y_3Al_5O_{12}$:Ce phosphor (hereinafter, referred to as a "YAG group phosphor") and the like. For this reason, in order to provide reddish color tone light emission, the mixture ratio of a reddish orange phosphor is necessarily increased. In this case, the relative intensity of the light emission may decrease.

Therefore, the present invention is aimed at providing a light emitting phosphor capable of emitting reddish orange light at high intensity, and a light emitting device using the phosphor.

Means to Solve the Problems

The inventors have diligently studied to solve the above problems, and as a result have solved the aforementioned problems and have developed the present invention.

A phosphor according to the present invention absorbs light from an excitation light source in proximity to 460 nm and converts the wavelength of the light so that the color tone values x and y of the converted light fall within ranges $0.400 \leq x \leq 0.580$ and $0.400 \leq y \leq 0.580$ in the CIE chromaticity diagram. The phosphor includes at least one element selected from the group consisting of Mg, Ca, Sr, Ba and Zn, at least one element selected from the group consisting of Si, Ge and Sn, and an activator that contains at least Eu. Accordingly, it is possible to provide a high luminous phosphor that emits light in a predetermined color tone range. In particular, it is preferable that the phosphor is a silicate group phosphor that contains at least one element selected from the group consisting of Si, Ge and Sn, and essentially contains Si. It is because a phosphor with excellent weather resistance can be provided.

A phosphor according to the present invention is represented by the general formula $M^1_{5-x}Eu_xM^2_mM^3_nO_{2m+(3/2)n+5}$ where x, m and n fall within ranges $0.0001 \leq x \leq 0.3$, $1.0 \leq m < 2.5$ and $0 \leq n < 2.5$, $M^1$ is at least one element selected from the group consisting of Mg, Ca, Sr, Ba and Zn, $M^2$ is at least one element selected from the group consisting of Si, Ge and Sn, and $M^3$ is at least one element selected from the group consisting of B, Al, Ga, In and rare earth elements. Accordingly, it is possible to provide a high luminous phosphor that emits reddish orange light or the like.

A light emitting device according to the present invention includes a light emitting element that has a light emission peak wavelength in a range from 300 nm to 530 nm, and a phosphor that absorbs light from said light emitting element and converts the wavelength of the light to emit light with a light emission peak wavelength different from said light emitting element. The phosphor is represented by the general formula $M^1_{5-x}Eu_xM^2_mM^3_nO_{2m+(3/2)n+5}$ where x, m and n fall within ranges $0.0001 \leq x \leq 0.3$, $1.0 \leq m < 2.5$ and $0 \leq n < 2.5$, $M^1$ is at least one element selected from the group consisting of Mg, Ca, Sr, Ba and Zn, $M^2$ is at least one element selected from the group consisting of Si, Ge and Sn, and $M^3$ is at least one element selected from the group consisting of B, Al, Ga, In and rare earth elements. Accordingly, it is possible to provide a light emitting device that can provide various types of light emission colors. Specifically, it is possible to provide a light emitting device that emits reddish orange range light, or a light emitting device that includes the phosphor in combination with a phosphor or the like that emits different color light to emit white range light.

The configurations according to the present invention can provide a phosphor that has excellent in weather resistance, and can emit light at high intensity.

BEST MODE FOR CARRYING OUT THE INVENTION

The following description will describe an embodiment and examples of a phosphor and a light emitting device according to the present invention. However, the present invention is not limited to the embodiment and the examples.
<Phosphor>
The following description will describe a phosphor according to the embodiment.

A phosphor according to the present invention absorbs light from an excitation light source of 460 nm and converts the wavelength of the light so that the color tone values x and y of the converted light fall within ranges $0.400 \leq x \leq 0.580$ and $0.400 \leq y \leq 0.580$ in the CIE chromaticity diagram. The phosphor includes at least one element selected from the group consisting of Mg, Ca, Sr, Ba and Zn, at least one element selected from the group consisting of Si, Ge and Sn, and an activator that contains at least Eu.

A phosphor according to the present invention is represented by the general formula $M^1_{5-x}Eu_xM^2_mM^3_nO_{2m+(3/2)n+5}$ where x, m and n fall within ranges $0.0001 \leq x \leq 0.3$, $1.0 \leq m < 2.5$ and $0 \leq n < 2.5$, $M^1$ is at least one element selected from the group consisting of Mg, Ca, Sr, Ba and Zn, $M^2$ is at least one element selected from the group consisting of Si, Ge and Sn, and $M^3$ is at least one element selected from the group consisting of B, Al, Ga, In and rare earth elements.

A silicate group phosphor that contains at least one element selected from the group consisting of Si, Ge and Sn, and essentially contains Si is described as the phosphor according to the present invention, however the present invention is not limited to this.

(Silicate Group Phosphor)

The phosphor is represented by the general formula $M^1_{5-x} Eu_x M^2_m M^3_n O_{2m+(3/2)n+5}$ where x, m and n fall within ranges $0.0001 \leq x \leq 0.3$, $1.0 \leq m < 2.5$ and $0 \leq n < 2.5$; $M^1$ is at least one element selected from the group consisting of Mg, Ca, Sr, Ba and Zn; $M^2$ is at least one element selected from the group consisting of Si, Ge and Sn, and essentially contains Si; and $M^3$ is at least one element selected from the group consisting of B, Al, Ga, In and rare earth elements. In the case of n=0, the phosphor is represented by $M^1_{5-x} Eu_x M^2_m O_{2m+5}$. It is preferable that $M^1$ contains at least one element selected from the group consisting of Mg, Ca, Sr, Ba and Zn, and essentially contains Sr. It is preferable that the rare earth group elements in $M^3$ are Pr, Nd, Dy, and Ho. It is because the phosphor emits light at high intensity.

The light excitation efficiency of the silicate group phosphor becomes low in a wavelength range longer than approximately 530 nm. Accordingly, the silicate group phosphor is efficiently excited by light in a wavelength range shorter than 530 nm. Also, the silicate group phosphor is efficiently excited by light in a wavelength range greater than 300 nm.

When excited, the silicate group phosphor emits light with light emission peak wavelength in a range from 550 to 630 nm. The light emission peak wavelength of the silicate group phosphor can be changed by variously changing the composition of the silicate group phosphor or by changing the excitation wavelength.

The values x, m, and n of the composition of the silicate group phosphor fall within ranges of $0.0001 \leq x \leq 0.3$, $1.0 \leq m < 2.5$, and $0 \leq n < 2.5$. It is preferable that x falls within a range of $0.01 \leq x \leq 0.3$. It is because this range can provide higher intensity. It is preferable that m falls within a range of $1.9 \leq m < 2.5$. It is because this range can provide higher intensity. Phosphors with various color tones can be provided by changing n.

(Silicate Group Phosphor Production Method)

The following description will describe a production method of a silicate phosphor $Sr_{4.8}Ba_{0.1}Eu_{0.1}Si_2O_9$ according to the present invention. However, the present invention is not limited to this.

$SrCO_3$, $BaCO_3$, $SiO_2$, and $Eu_2O_3$ are first adjusted at a predetermined composition ratio, and are mixed. Compounds such as oxide, carbonate, nitride, imide compound and amide compound can also be used instead of $SrCO_3$, $BaCO_3$, $SiO_2$, and $Eu_2O_3$. Also, flux such as $SrF_2$ and $BaF_2$ can be used, for example.

Subsequently, the aforementioned materials are measured, and are sufficiently mixed in a dry manner by a mixer such as a ball mill.

The material mixture is placed in a crucible, and is burnt in a reducing atmosphere. A tubular furnace, a box-shaped furnace, a high-frequency furnace, a metal furnace and the like can be used for burning. The burning is performed at burning temperature in a range from 1000° to 1600° C., however the burning temperature is not limited to this. A nitrogen-hydrogen atmosphere, a nitrogen atmosphere, an ammonia atmosphere, and an inert gas atmosphere such as argon can be used as the reducing atmosphere.

The thus-obtained burnt material is pulverized, dispersed and sieved. Consequently, the target silicate group phosphor can be obtained.

<Light Emitting Device>

Figure 1:
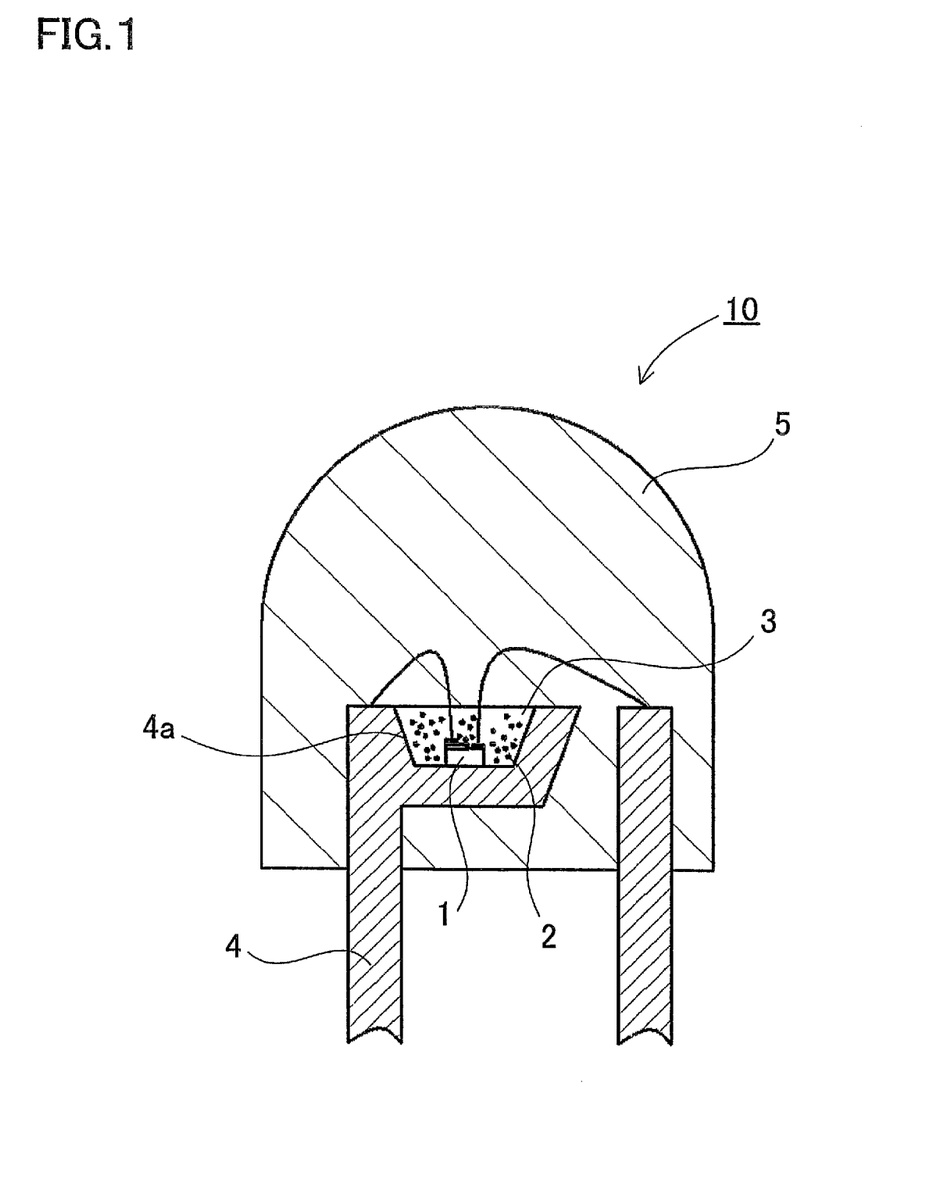
FIG. 1 is a schematic cross sectional view showing a light emitting device according to an embodiment.

The following description will describe a light emitting device according to the embodiment. FIG. 1 is a schematic cross sectional view showing the light emitting device according to the embodiment.

In a light emitting device 10 according to the embodiment, a light emitting element 1 is arranged in a cup portion 4a of a lead frame 4. A sealing member 3 is arranged in the cup portion 4a. A phosphor 2 is mixed in the sealing member 3. The cup portion 4a and the sealing member 3 are covered by a mold sealing member 5. The phosphor 2 contains at least the aforementioned silicate group phosphor. The lead frame 4 is composed of a pair of, positive and negative terminal. The terminals are electrically connected to the positive and negative electrodes of the light emitting element 1.

The light emitting element 1 is an electroluminescent element that converts electric energy into light emission. Specifically, examples of the electroluminescent elements can be provided by a light emitting diode, a laser diode, a surface emission laser diode, an inorganic electroluminescence element, an organic electroluminescence element, and the like. In particular, from the viewpoint of high output of semiconductor light emitting elements, a light emitting diode or a surface emission laser diode is preferably used. The light emitting element 1 is not limited if the light emission peak wavelength of the light emitting element 1 falls within a range from the ultraviolet range on the longer wavelength side to the visible light range on the shorter wavelength side. In particular, a light emitting element is preferably used that has a light emission peak wavelength in a range from 530 to 630 nm that excites the silicate group phosphor at high efficiency.

The phosphor 2 may contain other phosphor than the silicate group phosphor. As for the other phosphor, it is preferable to use at least one material selected from an alkaline-earth halogen apatite phosphor, an alkaline-earth-metal boric-acid halogen phosphor, an alkaline-earth-metal aluminate phosphor, alkaline-earth silicate, alkaline-earth sulfide, rare-earth oxide sulfide, alkaline-earth thiogallate, alkaline-earth silicon nitride and germanate that are mainly activated by lanthanoid series such as Eu, or Mn; rare earth aluminate and rare earth silicate that are mainly activated by lanthanoid series such as Ce; and an organic material and organic complex that are mainly activated by lanthanoid series such as Eu. Specifically, the following phosphors can be used, however, the other phosphor is not limited to these phosphors.

An example of alkaline-earth halogen apatite phosphor that is mainly activated by a lanthanoid group element such as Eu or a transition metal group element such as Mn is provides by $M_5(PO_4)_3X:R$ (where M is at least one element selected from the group consisting of Sr, Ca, Ba, Mg and Zn; X is at least one element selected from the group consisting of F, Cl, Br and I; and R is at least one selected from the group consisting of Eu, Mn, and combination of Eu and Mn) or the like.

An example of alkaline-earth-metal boric-acid halogen phosphor is provided by $M_2B_5O_9X:R$ (where M is at least one element selected from the group consisting of Sr, Ca, Ba, Mg and Zn; X is at least one element selected from the group consisting of F, Cl, Br and I; and R is at least one selected from the group consisting of Eu, Mn, and combination of Eu and Mn) or the like.

Examples of alkaline-earth-metal aluminate phosphors are provided by $SrAl_2O_4$:R, $Sr_4Al_{14}O_{25}$:R, $CaAl_2O_4$:R, $BaMg_2Al_{16}O_{27}$:R, and $BaMgAl_{10}O_{17}$:R (where R is at least one selected from the group consisting of Eu, Mn, and combination of Eu and Mn) and the like.

Examples of rare-earth sulfide phosphors are provided by $La_2O_2S$:Eu, $Y_2O_2S$:Eu, $Gd_2O_2S$:Eu, and the like.

Examples of rare earth aluminate phosphors that are mainly activated by a lanthanoid group element such as Ce are provided by YAG group phosphors that are represented by the composition formulas $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, $(Y,Gd)_3(Al, Ga)_5O_{12}$, and the like.

Additionally, examples of the other phosphors are provided by CaS:Eu, $Zn_2GeO_4$:Mn, and $MGa_2S_4$:Eu (where M is at least one element selected from the group consisting of Sr, Ca, Ba, Mg and Zn; and X is at least one element selected from the group consisting of F, Cl, Br and I) and the like. Also, examples of the other phosphors are provided by $M_2Si_5N_8$:Eu, $MSi_7N_{10}$:Eu, $M_{1.8}Si_5O_{0.2}N_8$:Eu, and $M_{0.9}Si_7O_{0.1}N_{10}$:Eu (where M is at least one element selected from the group consisting of Sr, Ca, Ba, Mg and Zn) and the like.

The aforementioned second examples of the other phosphors may contain at least one element selected the group consisting of Tb, Cu, Ag, Au, Cr, Nd, Dy, Co, Ni, Ti and the like in stead of Eu, or in addition to Eu, if desired.

Also, a phosphor other than the aforementioned phosphors can be used that has similar performance and effects.

These phosphors can be used as a phosphor that has a yellow, red, green or blue range emission spectrum of light that is excited by excitation light from the light emitting element 1, or has an intermediate color emission spectrum that lies between the yellow, red, green and blue ranges such as yellow and bluish green. In the case where these phosphors are used in combination with the silicate group phosphor, it is possible to provide light emitting devices with various light emission colors.

For example, in the case where the light emitting device 10 includes a light emitting element that emits blue light, and the silicate group phosphor 2 that emits reddish orange range light, it is possible to provide a light emitting device that emits amber color light.

Also, for example, in the case where the light emitting device 10 includes a light emitting element that emits blue light, a YAG group phosphor that emits yellowish green range light, and the silicate group phosphor 2 that emits reddish orange range light, it is possible to provide a light emitting device that emits white light with good color rendering. Accordingly, it is possible to provide a desired white light with a broad light emission spectrum.

It is preferable that an excellent heat and light resistance material is used for the sealing member 3. For example, an epoxy resin, a silicone resin, a urea resin or the like can be used. The sealing member 3 can contain a diffusion material, a coloring material, and an ultraviolet ray absorbing material.

The mold sealing member 5 is arranged to protect the light emitting element 1, wire lines, and a part of the lead frame 4. The mold sealing member 5 can have a convex or concave lens shape, and may have a multi-layer structure. Specifically, transparent resin with excellent transparency, weather resistance and temperature characteristics such as an epoxy resin, an urea resin and silicone resin, silica sol, glass, or the like can be used as the material of the mold sealing member 5. The mold sealing member 5 can include a diffusion material, a coloring material, an ultraviolet absorbing material, and a phosphor.

EXAMPLES

Figure 2:
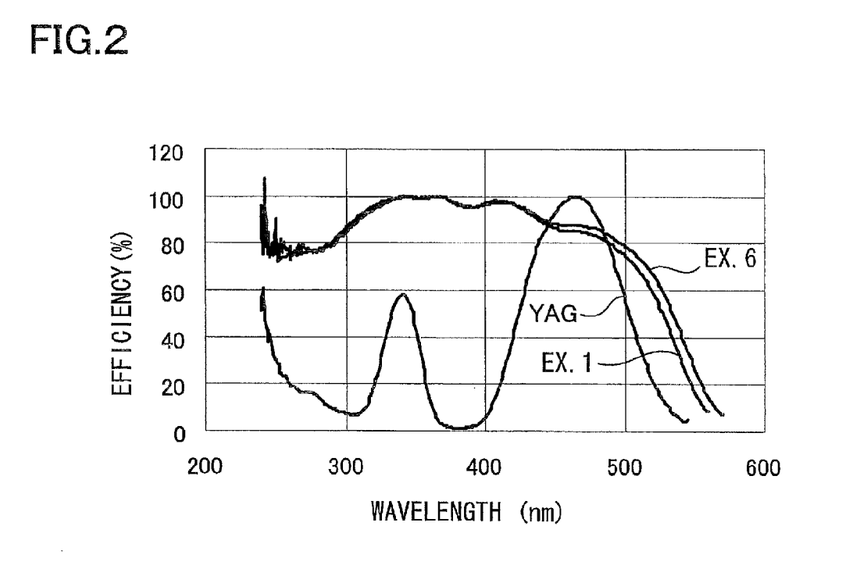
FIG. 2 is a diagram showing the excitation spectra of silicate group phosphors according to examples 1 and 6.
Figure 3:
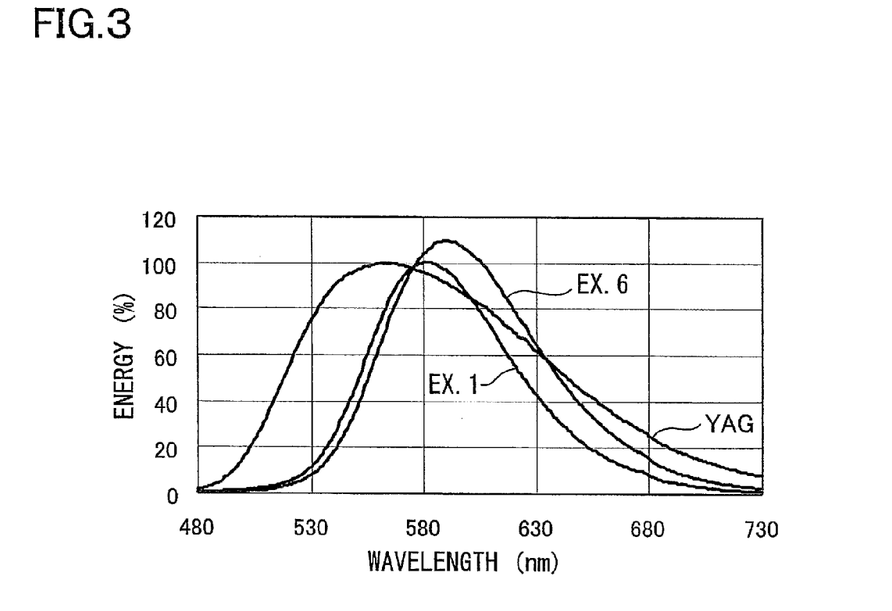
FIG. 3 is a diagram showing the light emission spectra of the silicate group phosphors according to the examples 1 and 6.
Figure 4:
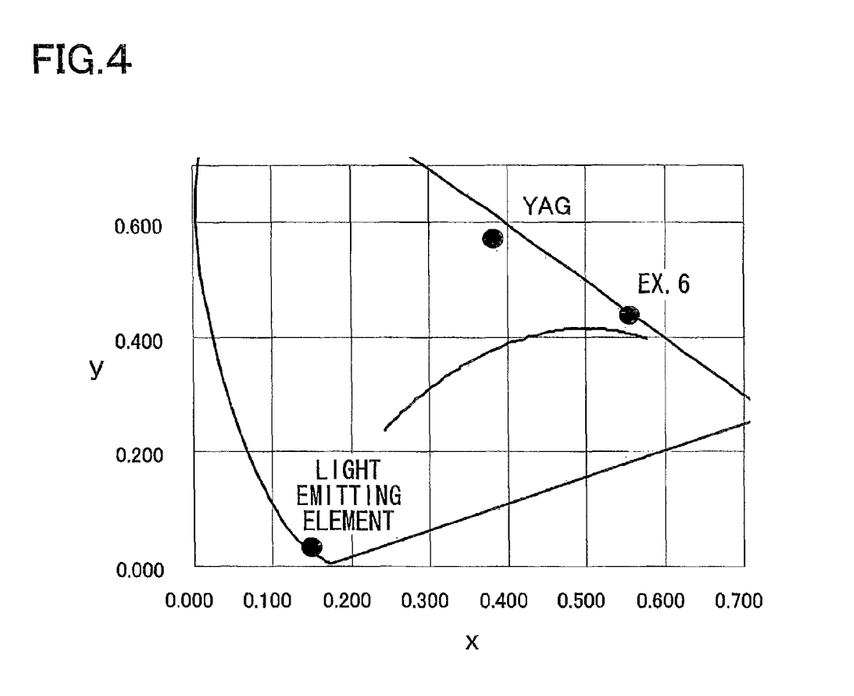
FIG. 4 is a CIE chromaticity diagram.

The following description will describe phosphors and light emitting devices according to examples of the present invention in more detail. FIG. 2 is a diagram showing the excitation spectra of silicate group phosphors according to examples 1 and 6. FIG. 3 is a diagram showing the light emission spectra of the silicate group phosphors according to the examples 1 and 6. FIG. 4 is a CIE chromaticity diagram. The CIE chromaticity diagram shows the example 6 as one example of phosphor according to the present invention. The black body locus is shown in the CIE chromaticity diagram. The general formula of the silicate group phosphor is represented by $M^1_{5-x}Eu_xM^2_mM^3_nO_{2m+(3/2)n+5}$ where x, m and n fall within ranges $0.0001 \leq x \leq 0.3$, $1.0 \leq m < 2.5$ and $0 \leq n < 2.5$, $M^1$ is at least one element selected from the group consisting of Mg, Ca, Sr, Ba and Zn, $M^2$ is at least one element selected from the group consisting of Si, Ge and Sn, and $M^3$ is at least one element selected from the group consisting of B, Al, Ga, In and rare earth elements. All of silicate group phosphors according to examples 1 to 48 fall within the composition range. The following tables show the composition of the silicate group phosphors according to the examples 1 to 48 before burning.

In the examples 1 to 10 and 12 to 48, the color tone values x and y of the phosphors are measured in fluorescent radiation when an excitation light source of approximately 460 nm is used. The relative intensity of the phosphors represents comparison with $(Y_{0.8}Gd_{0.2})_3Al_5O_{12}$:Ce.

In the example 11, the color tone values x and y of the phosphor are measured in fluorescent radiation when an excitation light source of approximately 400 nm is used. The relative intensity of the phosphor represents comparison with $SrAl_2O_4$:Eu.

Examples 1 to 11

The silicate group phosphor according to the example 1 has the composition of $Sr_{4.9}Eu_{0.1}Si_2O_9$. The silicate group phosphors according to the examples 2 to 11 have the composition $(Sr, Ba)_{4.9}Eu_{0.1}Si_2O_9$. The composition ratio between Sr and Ba is shown in the following table. In the silicate group phosphors according to the examples 1 to 11, in the case of x=0.1, m=2 and n=0, the composition ratio of $M^1$ is changed.

The measurement result of the silicate group phosphors according to the examples 1 to 11 is shown in the following table.

TABLE 1

| | Composition (Material) | | | | | Body Color (After Treatment) | Chromaticity | | Intensity (%) |
|---|---|---|---|---|---|---|---|---|---|
| | Sr | Ba | $M^3$ | Eu | Si | | x | y | |
| Ex. 1 | 4.9 | 0 | — | 0.1 | 2 | Yellowish Orange | 0.516 | 0.478 | 69.2 |
| Ex. 2 | 4.8 | 0.1 | — | 0.1 | 2 | Orange | 0.533 | 0.461 | 78.6 |
| Ex. 3 | 4.7 | 0.2 | — | 0.1 | 2 | Orange | 0.542 | 0.453 | 76.3 |
| Ex. 4 | 4.6 | 0.3 | — | 0.1 | 2 | Orange | 0.544 | 0.450 | 71.2 |
| Ex. 5 | 4.5 | 0.4 | — | 0.1 | 2 | Orange | 0.552 | 0.443 | 74.9 |
| Ex. 6 | 4.4 | 0.5 | — | 0.1 | 2 | Orange | 0.555 | 0.439 | 71.9 |
| Ex. 7 | 4.3 | 0.6 | — | 0.1 | 2 | Orange | 0.558 | 0.435 | 76 |
| Ex. 8 | 4.2 | 0.7 | — | 0.1 | 2 | Orange | 0.561 | 0.433 | 70.4 |
| Ex. 9 | 4.1 | 0.8 | — | 0.1 | 2 | Orange | 0.543 | 0.449 | 48.3 |
| Ex. 10 | 3.9 | 1 | — | 0.1 | 2 | Light Orange | 0.548 | 0.445 | 25.5 |
| Ex. 11 | 2.4 | 2.5 | — | 0.1 | 2 | Yellowish Green by 400 nm | 0.271 | 0.598 | 36.8 |

The production method of the silicate group phosphor according to the example 6 is now described as an example of phosphor according to the present invention. The phosphors according to the examples 1 to 48 can be produced substantially similarly to this method.

$SrCO_3$, $BaCO_3$, $SiO_2$ and $Eu_2O_3$ are prepared as materials, and $SrF_2$ is prepared as flux. They are adjusted to provide the composition ratio of $Sr_{4.4}Ba_{0.5}Eu_{0.1}Si_2O_3$ and are mixed.

| | |
|---|---|
| $SrCO_3$ | 129.9 g |
| $BaCO_3$ | 19.7 g |
| $SiO_2$ | 24.0 g |
| $Eu_2O_3$ | 3.52 g |
| $SrF_2$ | 0.62 g |

The above materials are measured, and are sufficiently mixed in a dry manner by a mixer. The mixed materials are placed in the crucible. The temperature in the crucible is increased to 1200° C. at a rate of 300° C./hr. The mixed material are burnt in a high temperature stage of 1200° C. for 3 hours. The thus-obtained burnt material is pulverized, dispersed and sieved. Consequently, the target phosphor powder is obtained. The phosphors according to the examples 1 to 48 are produced substantially similarly to the phosphor according to the example 6.

In the case where an excitation light source 460 nm is used, the silicate group phosphor according to the example 6 emits orange light. The relative light emission intensity of the silicate group phosphor according to the example 6 is 71.9% relative to the YAG group phosphor.

In all of the phosphors according to the examples 1 to 10 and 12 to 48, the color tone values x and y of the CIE chromaticity diagram fall within ranges of $0.400 \leq x \leq 0.580$ and $0.400 \leq y \leq 0.580$ in fluorescent radiation. In particular, in the phosphors according to the examples 2 to 10 and 12 to 23, the color tone values x and y of the CIE chromaticity diagram fall within ranges of $0.530 \leq x \leq 0.580$ and $0.420 \leq y \leq 0.470$ in fluorescent radiation.

Examples 12 to 15

The silicate group phosphors according to the examples 12 to 15 have the composition $(Sr, Ba)_{5-x}Eu_xSi_2O_9$. In the silicate group phosphors according to the examples 12 to 15, in the case of m=2 and n=0, the composition ratio of $M^1$ and x are changed. The measurement result of the silicate group phosphors according to the examples 12 to 15 is shown in the following table.

TABLE 2

| | Composition (Material) | | | | Body Color (After Treatment) | Chromaticity | | Intensity (%) |
|---|---|---|---|---|---|---|---|---|
| | Sr | Ba | $M^3$ | Eu | Si | | x | y | |
| Ex. 12 | 4.45 | 0.5 | — | 0.05 | 2 | Orange | 0.554 | 0.440 | 71.7 |
| Ex. 13 | 4.3 | 0.5 | — | 0.2 | 2 | Orange | 0.553 | 0.440 | 59.5 |
| Ex. 14 | 4.2 | 0.5 | — | 0.3 | 2 | Orange | 0.560 | 0.434 | 59.4 |
| Ex. 15 | 4.1 | 0.5 | — | 0.4 | 2 | Orange | 0.556 | 0.438 | 48.1 |

Examples 16 to 19

The silicate group phosphors according to the examples 16 to 19 have the composition of $Sr_{4.4}Ba_{0.5}Eu_{0.1}Si_mO_{2m+5}$. In the silicate group phosphors according to the examples 16 to 19, in the case of x=0.1, m=0 and n=0, the composition ratio of $M^1$ and m are changed. The measurement result of the silicate group phosphors according to the examples 16 to 19 is shown in the following table.

TABLE 3

| | Composition (Material) | | | | Body Color (After Treatment) | Chromaticity | | Intensity (%) |
|---|---|---|---|---|---|---|---|---|
| | Sr | Ba | $M^3$ | Eu | Si | | x | y | |
| Ex. 16 | 4.4 | 0.5 | — | 0.1 | 2.05 | Orange | 0.548 | 0.445 | 58.3 |
| Ex. 17 | 4.4 | 0.5 | — | 0.1 | 2.1 | Orange | 0.548 | 0.446 | 59.4 |
| Ex. 18 | 4.4 | 0.5 | — | 0.1 | 1.95 | Orange | 0.552 | 0.442 | 56.8 |
| Ex. 19 | 4.4 | 0.5 | — | 0.1 | 1.9 | Orange | 0.552 | 0.442 | 55.3 |

Examples 20 to 23, and Referential Examples 1 and 2

The silicate group phosphors according to the examples 20 to 23 have the composition $(Sr, Ba)_{4.9}Eu_{0.15}Si_2M^3{}_nO_{9.075}$. Pr, Nd, Dy, and Ho are used as $M^3$. In the silicate group phosphors according to the examples 20 to 23, in the case of x=0.1, m=2 and n=0.05, the element of $M^3$ is changed. The measurement result of the silicate group phosphors according to the examples 20 to 23 is shown in the following table.

TABLE 4

| | Composition (Material) | | | | | Body Color (After Treatment) | Chromaticity | | Intensity (%) |
|---|---|---|---|---|---|---|---|---|---|
| | Sr | Ba | $M^3$ | Eu | Si | | x | Y | |
| Ref. Ex. 1 | 4.35 | 0.5 | — | Mn 0.05 | 0.1 | 2 | Ocher Burnt Material Partially with Purple | | | |
| Ref. Ex. 2 | 4.3 | 0.5 | — | Mn 0.1 | 0.1 | 2 | Ocher Burnt Material Partially with Purple | | | |
| Ex. 20 | 4.4 | 0.5 | Pr 0.05 | — | 0.1 | 2 | Orange | 0.543 | 0.450 | 47.5 |
| Ex. 21 | 4.4 | 0.5 | Nd 0.05 | — | 0.1 | 2 | Orange | 0.541 | 0.451 | 46.7 |
| Ex. 22 | 4.4 | 0.5 | Dy 0.05 | — | 0.1 | 2 | Orange | 0.543 | 0.450 | 50.2 |
| Ex. 23 | 4.4 | 0.5 | Ho 0.05 | — | 0.1 | 2 | Orange | 0.544 | 0.449 | 51.2 |

Examples 24 to 27

The silicate group phosphors according to the examples 24 to 27 have the composition $(Sr, Ba, Ca)_{4.9}Eu_{0.1}Si_2O_9$. In the silicate group phosphors according to the examples 24 to 27, in the case of x=0.1, m=2 and n=0, the composition ratio of $M^1$ is changed. The measurement result of the silicate group phosphors according to the examples 24 to 27 is shown in the following table.

TABLE 5

| | Composition (Material) | | | | | Body Color (After Treatment) | Chromaticity | | Intensity |
|---|---|---|---|---|---|---|---|---|---|
| | Sr | Ba | Ca | Eu | Si | | x | y | (%) |
| Ex. 24 | 3.9 | 0.5 | 0.5 | 0.1 | 2 | Deep Reddish Purple | 0.453 | 0.530 | 33.4 |
| Ex. 25 | 3.4 | 0.5 | 1 | 0.1 | 2 | Reddish Deep Brown | 0.470 | 0.516 | 36.7 |
| Ex. 26 | 2.4 | 0.5 | 2 | 0.1 | 2 | Ocher | 0.499 | 0.490 | 43 |
| Ex. 27 | 1.4 | 0.5 | 3 | 0.1 | 2 | Ocher | 0.513 | 0.476 | 38.2 |

Example 28, and Referential Examples 3 to 5

The silicate group phosphor according to the example 28 has the composition of $Sr_{4.4}Ba_{0.5}Eu_{0.1}Si_mAl_nO_{2m+(3/2)n+5}$. In the silicate group phosphor according to the example 28, in the case of x=0.1, $M^3$=Al, m and n are changed. The measurement result of the silicate group phosphors according to the example 28 is shown in the following table.

TABLE 6

| | Composition (Material) | | | | | Body Color (After Treatment) | Chromaticity | | Intensity |
|---|---|---|---|---|---|---|---|---|---|
| | Sr | Ba | $M^3$ | Eu | Si | | x | y | (%) |
| Ref. Ex. 3 | 4.4 | 0.5 | Al 1 | 0.1 | 1 | Gray | | | |
| Ref. Ex. 4 | 4.4 | 0.5 | Al 0.2 | 0.1 | 1.8 | Ocher | | | |
| Ex. 28 | 4.4 | 0.5 | Al 2 | 0.1 | 2 | Light Yellow | 0.455 | 0.527 | 17.1 |
| Ref. Ex. 5 | 4.4 | 0.5 | Al 0.5 | 0.1 | 0.5 | Melted State. Purple. | | | |

Examples 29 and 30

The silicate group phosphors according to the examples 29 and 30 have the composition of $(Sr, Mg)_{4.9}Eu_{0.1}Si_2O_9$. In the silicate group phosphors according to the examples 29 and 30, in the case of x=0.1, m=2 and n=0, the composition ratio of $M^1$ is changed. The measurement result of the silicate group phosphors according to the examples 29 and 30 is shown in the following table.

TABLE 7

| | Composition (Material) | | | | | Body Color (After Treatment) | Chromaticity | | Intensity |
|---|---|---|---|---|---|---|---|---|---|
| | Sr | Ba | Mg | Eu | Si | | x | y | (%) |
| Ex. 29 | 4.4 | — | 0.5 | 0.1 | 2 | Yellow | 0.473 | 0.514 | 44.8 |
| Ex. 30 | 3.4 | — | 1.5 | 0.1 | 2 | Yellow | 0.417 | 0.555 | 50.1 |

Examples 31 to 41

The silicate group phosphors according to the examples 31 to 41 have the composition of $(Sr, Ca)_{4.9}Eu_{0.1}Si_2O_9$. In the silicate group phosphors according to the examples 31 to 41, in the case of x=0.1, m=2 and n=0, the composition ratio of $M^1$ is changed. The measurement result of the silicate group phosphors according to the examples 31 to 41 is shown in the following table.

TABLE 8

| | Composition (Material) | | | | | Body Color (After Treatment) | Chromaticity | | Intensity |
|---|---|---|---|---|---|---|---|---|---|
| | Sr | Ba | Ca | Eu | Si | | x | y | (%) |
| Ex. 31 | 4.8 | — | 0.1 | 0.1 | 2 | Reddish Purple | 0.498 | 0.491 | 29.8 |
| Ex. 32 | 4.6 | — | 0.3 | 0.1 | 2 | Reddish Purple | 0.502 | 0.488 | 27.9 |
| Ex. 33 | 4.4 | — | 0.5 | 0.1 | 2 | Reddish Purple | 0.502 | 0.487 | 27.9 |
| Ex. 34 | 4.2 | — | 0.7 | 0.1 | 2 | Reddish Purple | 0.507 | 0.483 | 33.6 |
| Ex. 35 | 3.9 | — | 1 | 0.1 | 2 | Reddish Brown | 0.515 | 0.476 | 39.5 |
| Ex. 36 | 3.4 | — | 1.5 | 0.1 | 2 | Light Brown | 0.530 | 0.462 | 33 |
| Ex. 37 | 2.9 | — | 2 | 0.1 | 2 | Light Brown | 0.546 | 0.446 | 29.2 |
| Ex. 38 | 2.5 | — | 2.4 | 0.1 | 2 | Light Brown | 0.551 | 0.440 | 32.8 |
| Ex. 39 | 1.9 | — | 3 | 0.1 | 2 | Light Brown | 0.547 | 0.441 | 22.8 |
| Ex. 40 | 1.4 | — | 3.5 | 0.1 | 2 | Light Brown | 0.536 | 0.449 | 20.6 |
| Ex. 41 | 0.3 | — | 4.6 | 0.1 | 2 | Light Ocher | 0.475 | 0.490 | 8 |

Examples 42 to 45

The silicate group phosphors according to the examples 42 to 45 have the composition of $M^1_{4.9}Eu_{0.1}Si_2O_9$. In the silicate group phosphors according to the examples 42 to 45, in the case of x=0.1, m=2 and n=0, the composition ratio of $M^1$ is changed. The measurement result of the silicate group phosphors according to the examples 42 to 45 is shown in the following table.

TABLE 9

| | Composition (Material) | | | | | Body Color (After Treatment) | Chromaticity | | Intensity |
|---|---|---|---|---|---|---|---|---|---|
| | Sr | Ba | Ca | Eu | Si | | x | y | (%) |
| Ex. 42 | — | 4.6 | 0.3 | 0.1 | 2 | Purple Slightly Mixed with Brown | | | |
| Ex. 43 | — | 2.5 | 2.4 | 0.1 | 2 | Light Ocher | | | |
| Ex. 44 | — | 0.3 | 4.6 | 0.1 | 2 | Light Ocher | 0.497 | 0.483 | 19.9 |
| Ex. 45 | — | — | 4.9 | 0.1 | 2 | Light Ocher | 0.460 | 0.490 | 5.5 |

Examples 46 to 48

The silicate group phosphors according to the examples 46 to 48 have the composition of $Sr_{4.4}Ba_{0.5}Eu_{0.1}Si_2B_nO_{9+(3/2)n}$. In the silicate group phosphors according to the examples 46 to 48, in the case of x=0.1, m=2 and $M^3$=B, n is changed. The measurement result of the silicate group phosphors according to the examples 46 to 48 is shown in the following table.

TABLE 10

| | Composition (Material) | | | | | Body Color (After Treatment) | Chromaticity | | Intensity |
|---|---|---|---|---|---|---|---|---|---|
| | Sr | Ba | $M^3$ | Eu | Si | | x | y | (%) |
| Ex. 46 | 4.4 | 0.5 | B 0.01 | 0.1 | 2 | Yellow | 0.545 | 0.448 | 50.1 |
| Ex. 47 | 4.4 | 0.5 | B 0.03 | 0.1 | 2 | Yellow | 0.543 | 0.450 | 37.7 |
| Ex. 48 | 4.4 | 0.5 | B 0.05 | 0.1 | 2 | Yellow | 0.545 | 0.448 | 31 |

Comparative Examples 1 and 2

A silicate group phosphor according to a comparative example 1 has the composition of $Sr_{4.4}Ba_{0.5}Eu_{0.1}Si_3O_{11}$. A silicate group phosphor according to a comparative example 2 has the composition of $Sr_{4.4}Ba_{0.5}Eu_{0.1}Si_{2.5}O_{10}$. In the silicate group phosphors according to the comparative examples 1 and 2, x, m and n are set as x=0.1, m=3 or 2.5, and n=0. The measurement result of the silicate group phosphors according to the comparative examples 1 and 2 is shown in the following table.

TABLE 11

| | Composition (Material) | | | | | Body Color (After Treatment) | Chromaticity | | Intensity (%) |
|---|---|---|---|---|---|---|---|---|---|
| | Sr | Ba | $M^3$ | Eu | Si | | x | y | |
| Comp. Ex. 1 | 4.4 | 0.5 | — | 0.1 | 3 | Yellow Burnt Material | 0.447 | 0.537 | 74.2 |
| Comp. Ex. 2 | 4.4 | 0.5 | — | 0.1 | 2.5 | Yellow Burnt Material | 0.467 | 0.521 | 43.8 |

Examples 49 to 59

Figure 5:
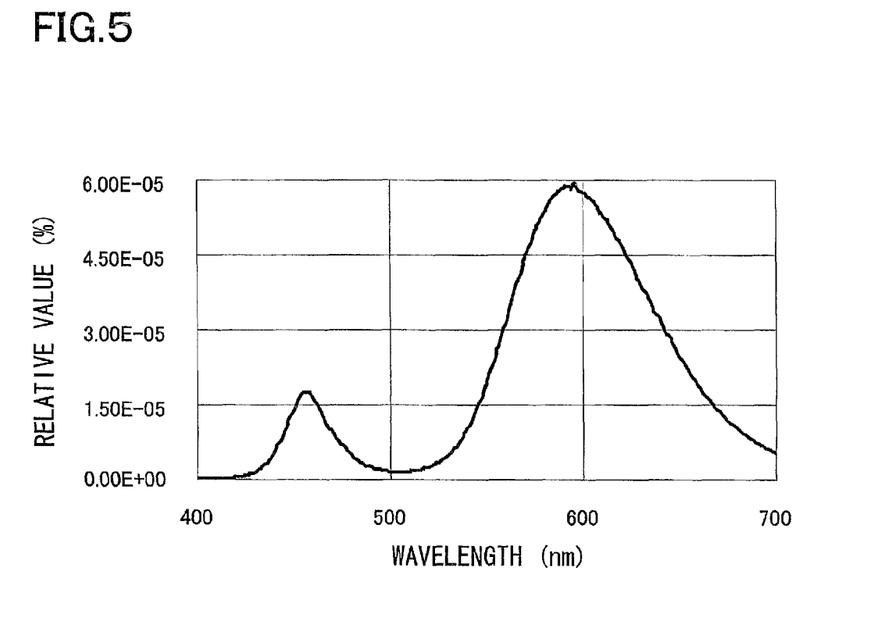
FIG. 5 is a diagram showing the light emission spectrum of a light emitting device according to an example 49.
Figure 6:
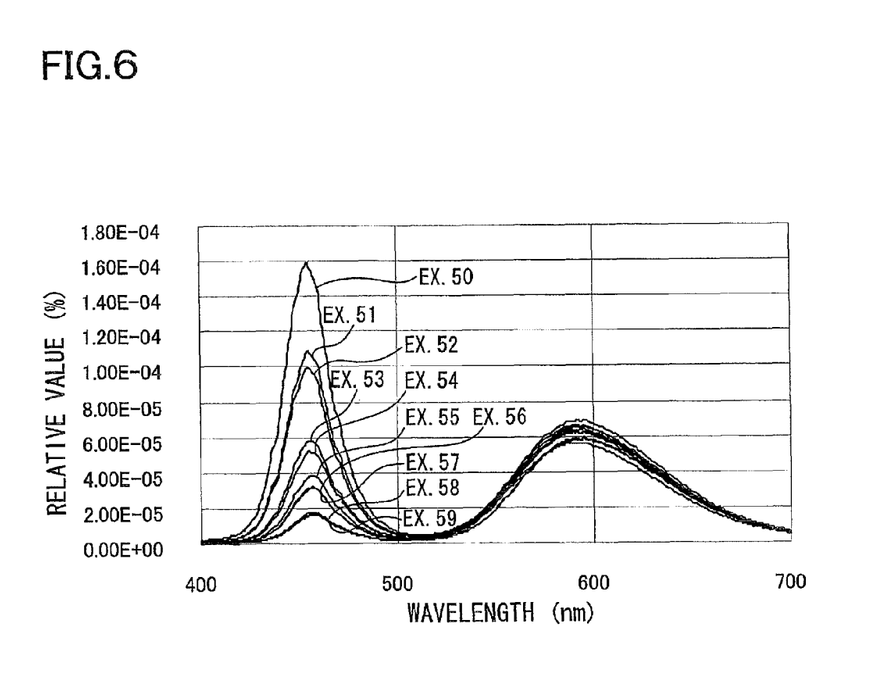
FIG. 6 is a diagram showing the light emission spectra of light emitting devices according to examples 50 to 59.

Light emitting devices according to examples 49 to 59 are described. FIG. 1 is a schematic cross sectional view showing the light emitting device according to the embodiment. FIG. 4 is a CIE chromaticity diagram. The CIE chromaticity diagram shows the phosphor according to the example 6 as one example of phosphor according to the present invention. FIG. 5 is a diagram showing the light emission spectrum of the light emitting device according to the example 49. FIG. 6 is a diagram showing the light emission spectra of the light emitting devices according to the examples 50 to 59.

The light emitting device 10 includes the light emitting element 1 that has a light emission peak wavelength of approximately 460 nm, and the silicate group phosphor 2 according to the example 6 that has the composition of $Sr_{4.4}Ba_{0.5}Eu_{0.1}Si_2O_9$. The chromaticity coordinates of the light emitting element 1 and the phosphor 2 are shown in the CIE chromaticity diagram. The light emitting element 1 has the chromaticity coordinates of x=0.149, and y=0.032. When the phosphor 2 is excited by the light emitting element 1 that has a light emission peak wavelength of approximately 460 nm, the chromaticity coordinates x and y of the phosphor 2 are x=0.560, and y=0.430.

The illustrated light emitting device 10 according to the example 49 can be provided that emits amber color light. Also, the light emitting devices 10 according to the examples 50 to 59 can be produced by adjustment of the amount of the phosphor 2 according to the example 6 that is provided in the cup portion 4a. The phosphor according to the example 59 contains a larger amount of the phosphor 2 than the phosphor according to the example 50. Also, the phosphor according to the example 59 has a larger amount of reddish orange color component than the phosphor according to the example 50. The light emitting devices 10 according to the examples 49 to 59 have chromaticity that is located in proximity to the straight line that connects the chromaticity of the light emitting element 1 and the chromaticity of the phosphor 2 according to the example 6 in the CIE chromaticity diagram.

Examples 60 to 67

Figure 7:
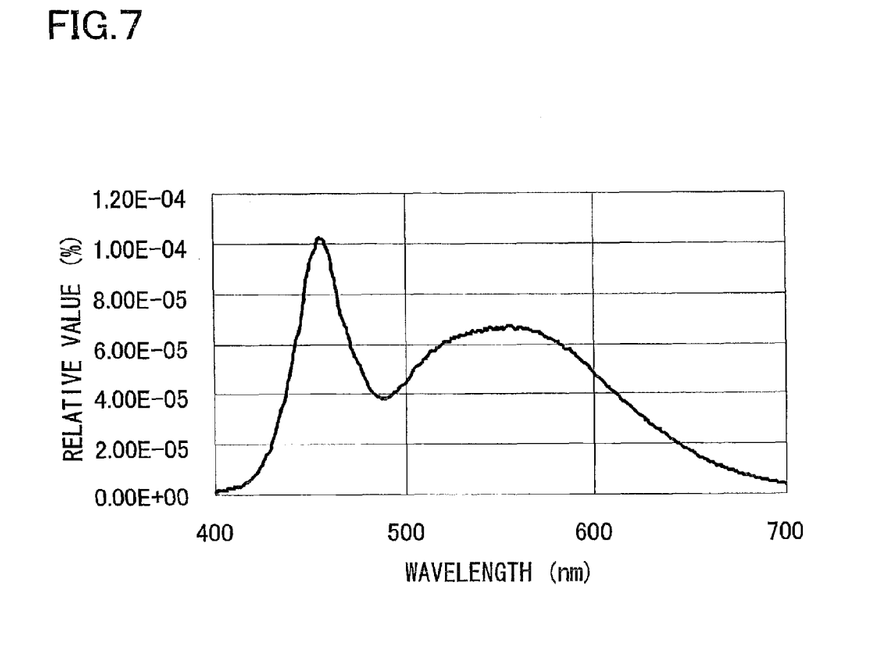
FIG. 7 is a diagram showing the light emission spectrum of a light emitting device according to an example 60.
Figure 8:
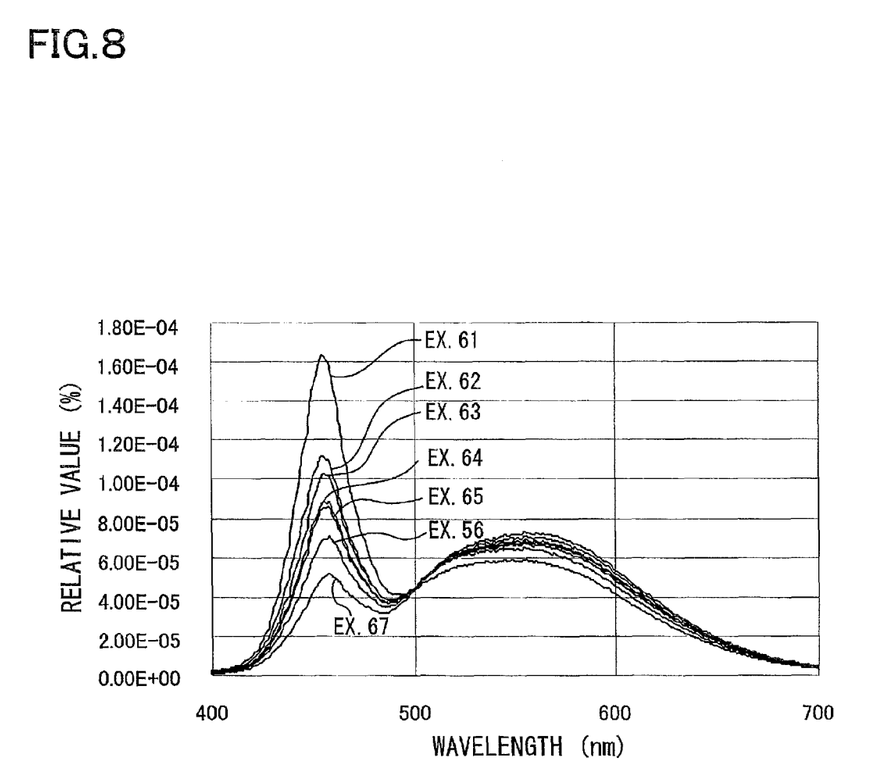
FIG. 8 is a diagram showing the light emission spectra of light emitting devices according to examples 61 to 67.

Light emitting devices according to examples 60 to 67 are described. FIG. 1 is a schematic cross sectional view showing the light emitting device according to the embodiment. FIG. 4 is a CIE chromaticity diagram. The CIE chromaticity diagram shows the phosphor according to the example 6 as an example of phosphor according to the present invention, and $(Y_{0.8}Gd_{0.2})_3Al_5O_{12}$:Ce. FIG. 7 is a diagram showing the light emission spectrum of the light emitting device according to the example 60. FIG. 8 is a diagram showing the light emission spectra of the light emitting devices according to the examples 61 to 67.

The light emitting device 10 includes the light emitting element 1 that has a light emission peak wavelength of approximately 460 nm, and the phosphor 2 that contains the silicate group phosphor 2 according to the example 6 that has the composition of $Sr_{4.4}Ba_{0.5}Eu_{0.1}Si_2O_9$ and a YAG phosphor that has the composition of $(Y_{0.8}Gd_{0.2})_3Al_5O_{12}$:Ce. The chromaticity coordinates of the light emitting element 1 and the phosphor 2 are shown in the CIE chromaticity diagram. The light emitting element 1 has the chromaticity coordinates of x=0.149, and y=0.032. When the silicate group phosphor is excited by the light emitting element 1 that has a light emission peak wavelength of approximately 460 nm, the chromaticity coordinates x and y of the silicate group phosphor are x=0.560, and y=0.430. When the YAG phosphor is excited by the light emitting element 1 that has a light emission peak wavelength of approximately 460 nm, the chromaticity coordinates x and y of the YAG phosphor are x=0.384, and y=0.572.

The illustrated light emitting device 10 according to the example 60 can be provided that emits white light in that a reddish orange color component is increased. The light emitting device 10 according to the example 60 has high color rendering. Also, the light emitting devices 10 according to the examples 61 to 67 can be produced by adjustment of the amounts of the silicate group phosphor 2 and the YAG group phosphor that are provided in the cup portion 4a.

The light emitting devices 10 according to the examples 61 to 67 have chromaticity that is located in proximity to the interior of a triangle that is defined by the chromaticity of the light emitting element 1, the chromaticity of the silicate group phosphor, and the chromaticity of the YAG phosphor in the CIE chromaticity diagram.

INDUSTRIAL APPLICABILITY

A light emitting device according to the present invention can be used for a signal light, a lighting device, a display, an indicator, various types of light sources and the like, and can be used as a light emitting device that includes a phosphor.

EXPLANATION OF REFERENCE LETTERS OR NUMERALS

1 Light Emitting Element
2 Phosphor
3 Sealing Member
4 Lead Frame
5 Mold Sealing Member
10 Light Emitting Device

The invention claimed is:

1. A phosphor that is represented by the general formula $M^1_{5-x}Eu_xM^2_mM^3_nO_{2m+(3/2)n+5}$ where x, m and n fall within ranges $0.0001 \leq x \leq 0.3$, $1.0 \leq m < 2.5$ and $0 \leq n < 2.5$, $M^1$ is at least one element selected from the group consisting of Mg, Ca, Sr, Ba and Zn, $M^2$ is at least one element selected from the group consisting of Si, Ge and Sn, and $M^3$ is at least one element selected from the group consisting of B, Al, Ga, In and rare earth elements.

2. A light emitting device comprising:
a light emitting element that has a light emission peak wavelength in a range from 300 nm to 530 nm; and
a phosphor that absorbs light from said light emitting element and converts the wavelength of the light to emit light with a light emission peak wavelength different from said light emitting element, wherein the phosphor is represented by the general formula $M^1_{5-x}Eu_xM^2_mM^3_nO_{2m+(3/2)n+5}$ where x, m and n fall within ranges $0.0001 \leq x \leq 0.3$, $1.0 \leq m < 2.5$ and $0 \leq n < 2.5$, $M^1$ is at least one element selected from the group consisting of Mg, Ca, Sr, Ba and Zn, $M^2$ is at least one element selected from the group consisting of Si, Ge and Sn, and $M^3$ is at least one element selected from the group consisting of B, Al, Ga, In and rare earth elements.

* * * * *